(12) United States Patent
Moeckel et al.

(10) Patent No.: US 8,409,992 B2
(45) Date of Patent: Apr. 2, 2013

(54) METHOD FOR PRODUCING A POLISHED SEMICONDUCTOR WAFER

(75) Inventors: Bertram Moeckel, Freiberg (DE); Helmut Franke, Burghausen (DE)

(73) Assignee: Siltronic AG, Munich (DE)

( * ) Notice: Subject to any disclaimer, the term of this patent is extended or adjusted under 35 U.S.C. 154(b) by 242 days.

(21) Appl. No.: 12/850,019

(22) Filed: Aug. 4, 2010

(65) Prior Publication Data

US 2011/0039411 A1 Feb. 17, 2011

(30) Foreign Application Priority Data

Aug. 12, 2009 (DE) .................. 10 2009 037 281

(51) Int. Cl.
*H01L 21/306* (2006.01)
*H01L 21/304* (2006.01)

(52) U.S. Cl. .......... 438/691; 257/E21.219; 257/E21.237

(58) Field of Classification Search ............... None
See application file for complete search history.

(56) References Cited

U.S. PATENT DOCUMENTS

| | | | |
|---|---|---|---|
| 5,045,505 A * | 9/1991 | Kimura ........................ 438/140 |
| 5,451,267 A | 9/1995 | Stadler et al. |
| 5,474,644 A | 12/1995 | Kato et al. |
| 5,497,085 A * | 3/1996 | Tian et al. ..................... 324/212 |
| 5,514,025 A * | 5/1996 | Hasegawa et al. .............. 451/44 |
| 5,928,060 A * | 7/1999 | Miller .............................. 451/5 |
| 5,928,066 A * | 7/1999 | Hasegawa et al. ........... 451/173 |
| 5,967,882 A * | 10/1999 | Duescher ....................... 451/57 |
| 6,048,254 A * | 4/2000 | Duescher ....................... 451/28 |
| 6,066,565 A * | 5/2000 | Kuroki et al. ................. 438/692 |
| 6,595,028 B1 * | 7/2003 | Miyamoto et al. ........... 65/30.14 |
| 6,842,257 B2 * | 1/2005 | Lee et al. ....................... 356/601 |
| 7,113,257 B2 * | 9/2006 | Brinkhof et al. ................ 355/53 |
| 7,407,891 B2 * | 8/2008 | Bauer et al. .................... 438/714 |
| 7,662,493 B2 * | 2/2010 | Machida et al. ........... 428/848.6 |
| 7,922,813 B2 * | 4/2011 | Schauer et al. ................. 117/84 |
| 8,152,598 B2 * | 4/2012 | Fukushima et al. ............ 451/11 |
| 2002/0135362 A1 * | 9/2002 | Lee et al. ........................ 324/212 |
| 2003/0022506 A1 | 1/2003 | Schwab et al. |
| 2003/0054650 A1 | 3/2003 | Wenski et al. |
| 2004/0222416 A1 | 11/2004 | Teuschler et al. |
| 2004/0257545 A1 * | 12/2004 | Brinkhof et al. ................ 355/53 |
| 2005/0173377 A1 | 8/2005 | Pietsch et al. |
| 2006/0040086 A1 | 2/2006 | Dolechek et al. |
| 2006/0046621 A1 * | 3/2006 | Phang et al. .................... 451/41 |
| 2006/0148385 A1 * | 7/2006 | Phang et al. .................... 451/41 |
| 2007/0062438 A1 * | 3/2007 | Schauer et al. ................. 117/89 |

(Continued)

FOREIGN PATENT DOCUMENTS

CN 1396632 A 2/2003
CN 101456163 A 6/2009

(Continued)

*Primary Examiner* — Allan Olsen
(74) *Attorney, Agent, or Firm* — Brooks Kushman P.C.

(57) ABSTRACT

A polished semiconductor wafer of high flatness is produced by the following ordered steps:
slicing a semiconductor wafer from a rod composed of semiconductor material,
material-removal processing of at least one side of the semiconductor wafer, and
polishing of at least one side of the semiconductor wafer, wherein the semiconductor wafer has, after the material-removing processing and before the polishing on at least one side to be polished, along its margin, a ring-shaped local elevation having a maximum height of at least 0.1 μm, wherein the local elevation reaches its maximum height within a 10 mm wide ring lying at the edge of the semiconductor wafer.

13 Claims, 3 Drawing Sheets

U.S. PATENT DOCUMENTS

| | | |
|---|---|---|
| 2007/0264911 A1 | 11/2007 | Mattes et al. |
| 2008/0096474 A1* | 4/2008 | Kato et al. ............... 451/57 |
| 2008/0113510 A1* | 5/2008 | Kato et al. ............... 438/691 |
| 2009/0142916 A1 | 6/2009 | Prenz et al. |
| 2009/0197359 A1* | 8/2009 | Iriguchi et al. ............ 438/16 |
| 2010/0323586 A1* | 12/2010 | Pietsch .................... 451/41 |

FOREIGN PATENT DOCUMENTS

| | | |
|---|---|---|
| DE | 100 02 354 A1 | 8/2001 |
| DE | 10 2004 053 308 A1 | 3/2006 |
| DE | 103 02 611 A1 | 10/2010 |
| EP | 0 750 967 A2 | 1/1997 |
| JP | 04-201178 A | 7/1992 |
| JP | 06-039707 A | 2/1994 |
| JP | 2001-244159 A | 9/2001 |
| JP | 2005-209862 A | 8/2005 |
| JP | 2005-223344 A | 8/2005 |
| JP | 2008-028259 A | 2/2008 |
| KR | 1020070109839 | 11/2007 |

* cited by examiner $S_2 = S_3$
$\gamma_2 = \gamma_3$
$\Delta_2 = \Delta_3$

METHOD FOR PRODUCING A POLISHED SEMICONDUCTOR WAFER

CROSS-REFERENCE TO RELATED APPLICATIONS

This application claims priority to German Patent Application No. DE 10 2009 037 281.4 filed Aug. 12, 2009 which is herein incorporated by reference.

BACKGROUND OF THE INVENTION

1. Field of the Invention

The invention relates to a method for producing a polished semiconductor wafer, comprising the following steps in the stated order:
slicing a semiconductor wafer from a rod composed of semiconductor material,
material-removal processing of at least one side of the semiconductor wafer, and
polishing of at least one side of the semiconductor wafer.

2. Background Art

A semiconductor wafer generally has a polished front side, onto which electronic devices are fabricated. Increasingly stringent requirements are being made of the flatness of the front side. In order to be able to produce the largest possible number of devices on a semiconductor wafer, the necessary flatness has to be ensured as closely as possible, right up to the edge of the front side.

Most endeavors for increasing the flatness of the side surfaces of the semiconductor wafer generally, and of the front sides specifically, concentrate consistently on steps for the material-removal processing of a semiconductor wafer which influence flatness. They include, in particular, steps such as lapping, grinding, and polishing of one or both side surfaces. In practice, at least one polishing process, implemented as single-side or double-side polishing always takes place. As illustrated by DE10302611A1, however, process steps such as etching the side surfaces can also affect flatness, in particular flatness in the edge region of the side surfaces. A semiconductor wafer is usually etched before a first polishing process in order to remove damage to the surface left by a preceding shaping process, for example as a result of grinding or lapping (or a combination of these methods) of the semiconductor wafer. The patent application cited discloses an etching method wherein the semiconductor wafer is exposed, during etching, to a flow of a liquid etchant that is guided against the margin of the semiconductor wafer. In order to obtain the flattest possible side surfaces of the semiconductor wafer up to the outermost edge during the etching process, the margin of the semiconductor wafer is shielded against the flowing etchant by means of a special shield during etching. Side surfaces of the semiconductor wafers that are as flat as possible up to the outermost edge before polishing are regarded as a prerequisite for polished semiconductor wafers also having a very good geometry in the edge region. However, it has been found that the geometry in the edge region is still in need of improvement even when the process of DE10302611A1 is employed.

SUMMARY OF THE INVENTION

It is an object of the present invention, therefore, to further improve the geometry of a polished semiconductor wafer in the edge region. These and other objects are achieved by means of a method for producing a polished semiconductor wafer, comprising the following steps in the stated order:
slicing a semiconductor wafer from a rod composed of semiconductor material,
material-removal processing of at least one side of the semiconductor wafer, and
polishing of at least one side of the semiconductor wafer, wherein the semiconductor wafer has, after the material-removal processing and before polishing on at least one side, a ring-shaped local elevation having a maximum height of at least 0.1 µm along its edge, wherein the local elevation reaches its maximum height within a 10 mm wide ring lying at the margin of the semiconductor wafer, i.e. proceeding inwardly from the wafer edge.

DETAILED DESCRIPTION OF THE PREFERRED EMBODIMENT(S)

Figure 1:
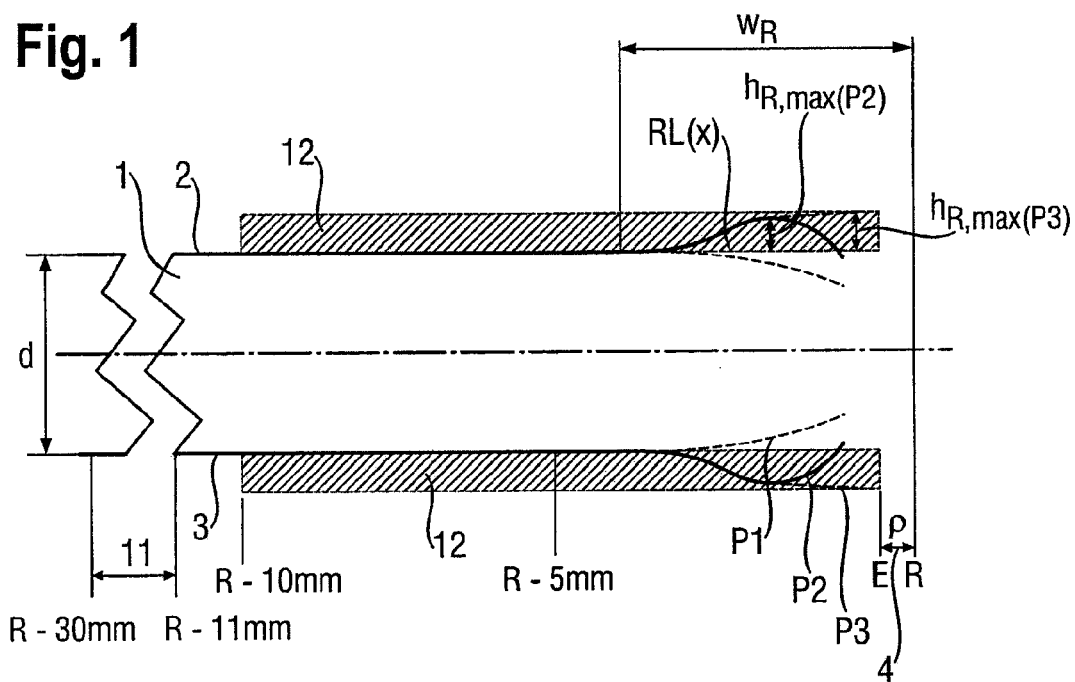
FIG. 1 illustrates the parameters for describing the elevation according to the invention at the margin of the semiconductor wafer.

The inventors have established that, in contrast to the teaching of DE10302611A1, a semiconductor wafer that is as flat as possible before polishing does not constitute the optimum prerequisite for obtaining an outstanding geometry at the wafer edge after polishing. Rather, according to the invention, a slight local elevation is provided in the region inward of the edge, i.e. the margin of the wafer, on at least the side of the semiconductor wafer that is to be polished, this elevation being removed during polishing. The polishing then leads to a semiconductor wafer which has, up to the outermost edge, an outstanding flatness without an appreciable edge roll-off. Preferably, the elevation is produced at the margin of the semiconductor wafer on each side which is subsequently subjected to polishing, that is to say only on one side in the case of single-side polishing, and on both sides in the case of double-side polishing.

The maximum height of the elevation and also the position of the height maximum are chosen depending on the process parameters of the subsequent polishing step. These include primarily contact pressure, polishing pad quality (hardness), composition of the polishing slurry, rotational speeds of the polishing plates and carriers, and primarily the amount of material removal to be realized by polishing. The material removal caused by polishing on each side of the semiconductor wafer that is to be polished is usually 3 to 30 µm. The higher the material removal, the greater the height the elevation must be in order to obtain the effect sought.

According to the invention, the maximum of the local elevation is situated in a ring-shaped region along the wafer margin which extends 10 mm inward from the edge. Preferably, the height maximum of the local elevation lies on the outermost five millimeters of the semiconductor wafer, that is to say on the surface of a ring which extends 5 mm inward from the wafer edge.

According to the invention, the height of the local elevation is at least 0.1 μm. Below the height of 0.1 μm, the desired effect can no longer be obtained even in the case of a very small material removal during subsequent polishing. Preferably, the elevation is not higher than 10 μm, since otherwise a very high polishing removal is required in order to obtain a flat wafer edge without an edge elevation. For these reasons, the height of the elevation before polishing most preferably lies in the range of 0.5 to 5 μm.

As a basis for the further description of the invention, firstly the geometrical parameters will be introduced using the example of a round semiconductor wafer (also see FIGS. 1-5). However, the invention can in principle also be applied to semiconductor wafers which deviate from a round form. The outermost periphery R of the semiconductor wafer 1 is situated at the distance of a radius r from the center of the semiconductor wafer 1 and forms the circumference of the semiconductor wafer. It is part of an edge 4 of the semiconductor wafer 1 that is provided with a profile which was produced mechanically by a shaping tool, for example a profile grinding disk, in a so-called edge rounding step. The inner end of the profiled edge of the semiconductor wafer, that is to say the transition from the facet of the edge profile to the substantially flat surface of the semiconductor wafer, is designated by E and lies within the periphery R by a distance ρ. The edge 4 of the semiconductor wafer can be rounded symmetrically or non-symmetrically. The margin region of the semiconductor wafer that is of particular interest according to the invention lies at a distance of 0 to 10 mm from the periphery R of the semiconductor wafer 1 on the front side 2 and the rear side 3 of the semiconductor wafer 1. The thickness d of the semiconductor wafer 1 corresponds to the distance between the front side 2 and the rear side 3 of the semiconductor wafer.

The height $h_R$ of the local elevation and also the position of its height maximum can be described by the edge roll-off (ERO). The ERO can be determined by means of commercially available measuring devices such as the device LER-310 from Kobelco Research Institute, Inc., which operates according to the measurement principle of oblique light phase shift interferometry. The measurement yields a radial profile h(x) of the topography of the semiconductor wafer. In this case, the front side or the rear side or both sides of the semiconductor wafer can be measured simultaneously.

For determining the variables that are essential for the invention (maximum height of the local elevation and the position of the maximum), an algorithm described in the standard SEMI M69 is used (see FIG. 1). In contrast to the parameter ROA described in the standard ("Roll-Off Amount after 3rd Order polynomial fitting and de-trending at position x"; size of the edge roll-off at the position x after third-order polynomial fitting and its subtraction), which is determined only at a predefined radial position, a continuous height profile is used for the description of the present invention, the determination of which is described below. In this case, x indicates the radial position as a distance in mm from the periphery R of the semiconductor wafer 1.

The basis for the description of the local elevation is the definition of a reference curve RL(x) by fitting a third-order polynomial to the measured radial profile h(x) of the topography of the semiconductor wafer in accordance with SEMI M69. For the purposes of the present invention, the reference curve RL(x) is fitted to the measured radial profile h(x) in a radial region 11 extending at a distance of from x=11 mm to x=30 mm from the wafer edge. Three different radial profiles h(x) are depicted in FIG. 1, and are designated by P1, P2 and P3 herein.

The third-order polynomial RL(x) obtained is subsequently extrapolated up to the edge (position x=0 mm) of the semiconductor wafer 1 and the height deviation $h_R(x)$ of the radial profile h(x) measured in the margin of 0 to 10 mm from the extrapolated curve RL(x) is determined by difference formation: $h_R(x)=h(x)-RL(x)$. This subtraction eliminates the global geometry of the semiconductor wafer (concave, convex), such that $h_R(x)$ actually only reflects the local deviation from the global geometry, this local deviation being crucial for the present invention. In this description, the size of the deviation as a function of the radial position is designated as "height of the elevation" $h_R(x)$, and the maximum positive deviation between actual radial profile and the extrapolated curve is designated as a "maximum height of the elevation" $h_{R,max}$. The radial position at which the elevation reaches its maximum height is designated hereinafter for short as the "position of the maximum" $x_{max}$. The present invention in any event requires a positive deviation at least in a partial region of the outermost 10 mm of the semiconductor wafer; its maximum height $h_{R,max}$ is at least 0.1 μm.

The parameter $h_R(x)$ can be specified both for the front side 2 and for the rear side 3 of the semiconductor wafer 1, positive values always indicating an elevation.

The position of the maximum of the elevation ($x_{max}$) can lie directly at the transition point E from the flat surface to the facet of the edge rounding of the semiconductor wafer 1, but also further in the direction of the center of the semiconductor wafer 1. A plateau is also possible. Three different forms are indicated by way of example in FIG. 1, wherein the profile P1 represents a profile that is not according to the invention. The profiles P2 and P3 are possible variants of the local elevation according to the invention in the margin. It has been found that the elevation in the margin leads to an improvement in the local geometry after polishing even when the $h_R(x)$ already falls again toward the edge. In this case, $h_R(max)$ can also be negative. The form (height and position of the maximum, gradient of the rise) can be set by means of the different production variants for the ring-shaped local elevation in the margin and thus be optimally adapted to the subsequent polishing step. However, it should in any case occur within the region 12 illustrated in FIG. 1, that is to say on the outermost ten millimeters of the semiconductor wafer.

The local elevation according to the invention at the margin of the semiconductor wafer should not be confused with a globally concave geometry which is known from the prior art and which is likewise intended to lead to an improvement in the flatness after a subsequent polishing process. Such a globally concave geometry as an initial geometry for a subsequent double-side polishing process is described in EP0750967A2, by way of example. According to the invention, by contrast, before the polishing, a local elevation is provided in the margin. It has been found that this leads, independently of the global geometry of the semiconductor wafers, to a minimization of the edge roll-off after a subsequent polishing step. This is manifested after polishing in the improvement in geometry parameters such as e.g. SFQR, SFQD, SBIR (in accordance with SEMI M1 appendix 1 and SEMI MF1530-0707), PSFQR (SEMI M70-1108), ESFQR, ESFQD, ESBIR, ESBID (SEMI M67-1108) and ZDD (SEMI M68-1108). The semiconductor wafer prepared according to the invention has a positive influence even on global parameters such as e.g. the GBIR (SEMI M1 appendix 1 and SEMI MF1530-0707) after polishing. The elevation according to the invention in the margin of the semiconductor wafer can be combined—depending on the requirements of the subsequent polishing step, that is to say depending on the change in the wafer geometry caused by the polishing step—with a globally concave, flat or alternatively convex basic form. It is thus possible to produce a semiconductor wafer optimized for the subsequent polishing step.

The starting material for producing the elevation in the margin is a semiconductor wafer sliced from a semiconductor rod ("ingot"), generally a single crystal, by means of a multi wire saw, for example. The semiconductor wafer is subsequently subjected to material-removal processing, which usually comprises a plurality of steps. By way of example, the wafer is mechanically processed, for example ground or lapped on both sides, in order to remove sawing grooves. The local elevation according to the invention is produced in a suitable step of the material-removing processing. This can be done by grinding or etching, for example.

Figure 2A:
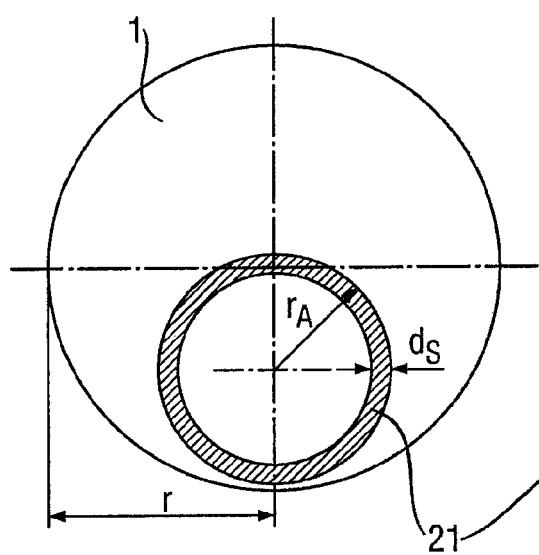
FIGS. 2a, 2b and 2c schematically show the production of an elevation according to the invention by the processing of a semiconductor wafer by means of cup grinding disks.
Figures 2B, 2C:
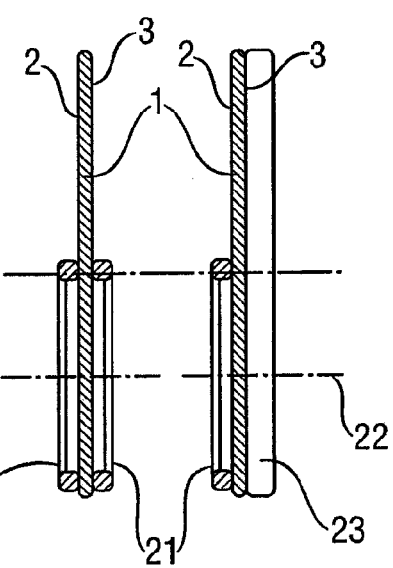
Figure 3:
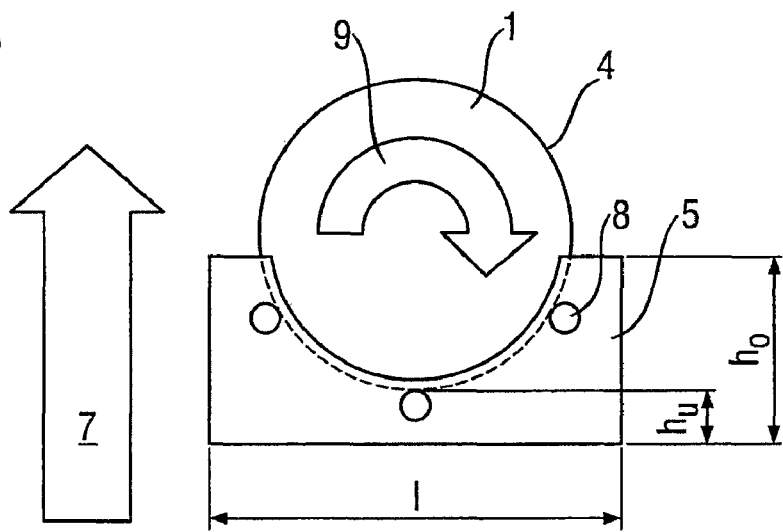
FIG. 3 schematically shows the production of an elevation according to the invention by etching using a shield that shields the wafer margin.

In a first embodiment of the invention, the elevation is produced by grinding, as illustrated schematically in FIG. 2.

The elevation can be produced either on one side of the semiconductor conductor wafer 1 by single-side grinding or on both sides of the semiconductor wafer 1 by sequential or simultaneous double-side grinding. The processing is in any case preferably effected by means of cup grinding disks 21 that rotate about an axis 22 perpendicular to the surface of the semiconductor wafer 1. In the case of single-side grinding and sequential double-side grinding, the semiconductor wafer 1 is fixed by one side on a chuck 23 during processing, while the other side of the semiconductor wafer 1 is processed by means of the cup grinding disk 21. This is done only on one side in the case of single-side grinding; in the case of sequential double-side grinding, the semiconductor wafer is turned after the processing of the first side, that is to say that the already processed first side is clamped on the chuck and the as yet unprocessed second side is ground. In the case of sequential double-side grinding, the elevation produced on the first side of the semiconductor wafer in the first step is not intended to bear on the chuck 23 in the second step, that is to say that the chuck 23 must in this case have a smaller diameter than the semiconductor wafer 1. In the case of simultaneous double-side grinding, by contrast, the semiconductor wafer is not firmly fixed, but rather is guided between two hydrostatic bearings in a substantially constrained-force-free manner (not illustrated) and is processed simultaneously on both sides by means of two mutually opposite cup grinding disks 21 that rotate about rotation axes 22 that are arranged collinearly. This technique is also referred to as "double disk grinding", DDG.

In order to produce the elevation at the margin of the semiconductor wafer, in the case of single- or double-side grinding care must be taken to ensure that the entire surface of the semiconductor wafer with the exception of the outermost edge region is processed. This can be achieved through the choice of a cup grinding disk 21 having a correspondingly small external radius $r_A$ and corresponding positioning of the semiconductor wafer 1 relative to the cup grinding disk 21, as illustrated in FIG. 2. In this case, the cup grinding disks always grind over the center of the semiconductor wafer but, in contrast to generally conventional practice, do not grind beyond the edge of the semiconductor wafer, but rather leave the edge region unprocessed. The radius r of the semiconductor wafer 1 and the desired width $w_R$ of the edge elevation to be produced are crucial for the precise dimensions of the cup grinding disks (external radius $r_A$ and width $d_s$ of the ring-shaped region covered with abrasive). The material removal depends on the margin elevation height $h_R$ that is desired—that is to say a height necessary for the subsequent polishing method.

Grinding is particularly suitable for producing a plateau-like local elevation.

A sharp step between the flat surface of the semiconductor wafer and the margin elevation can pose problems during the subsequent polishing process. Therefore, the grinding disks used can be beveled on the outer radius in order to prevent a sharp step from arising between processed region and non-processed region. Smoothing of the transition between flat surface and margin elevation can also be achieved by subsequent removal etching.

In accordance with a second embodiment, the elevation in the margin of the semiconductor wafer can also be produced by means of an etching method, for example in the manner described in DE10302611A1. In contrast to DE10302611A1, the shield and also the arrangement thereof relative to the semiconductor wafer are configured such that the edge region of the semiconductor wafer is shielded so well during etching that an elevation arises in the margin on account of the material removal that is reduced even further locally. A suitable arrangement is illustrated in an overview in FIG. 3 and in detail in FIGS. 4 and 5.

During etching (see FIG. 3), the semiconductor wafer 1, which is preferably substantially composed of silicon, is exposed to a flow of a liquid etchant that flows at a specific rate parallel to the side surfaces (front and rear sides 2, 3), to the edge 4 of the semiconductor wafer 1. The flow direction of the etchant is represented by the arrow 7 in FIG. 3. Appropriate etchants include both alkaline and acidic solutions. Acidic solutions are preferred, however, because the risk of their introducing metallic contaminants into the semiconductor material is significantly lower. A particularly preferred etchant contains aqueous hydrogen fluoride solution and at least one oxidizing acid, most preferably nitric acid, and if appropriate further additives. It is also particularly preferred for small gas bubbles to be dispersed in the etchant in order to obtain a uniform etching removal. This can be realized in accordance with U.S. Pat. No. 5,451,267, for example. In order to obtain a material removal which is as uniform as possible, the semiconductor wafers are rotated during etching. The rotation of the semiconductor wafers is illustrated by the arrow 9 in FIG. 3. The semiconductor wafer is caused to rotate by at least one rotating drive shaft 8, for example. Three drive shafts 8 are illustrated by way of example in FIG. 3. The shield 5 is situated upstream of the margin 4 of the semiconductor wafer 1 as seen in the flow direction 7, the shield shielding a part of the edge 4 against the etchant.

Figure 4:
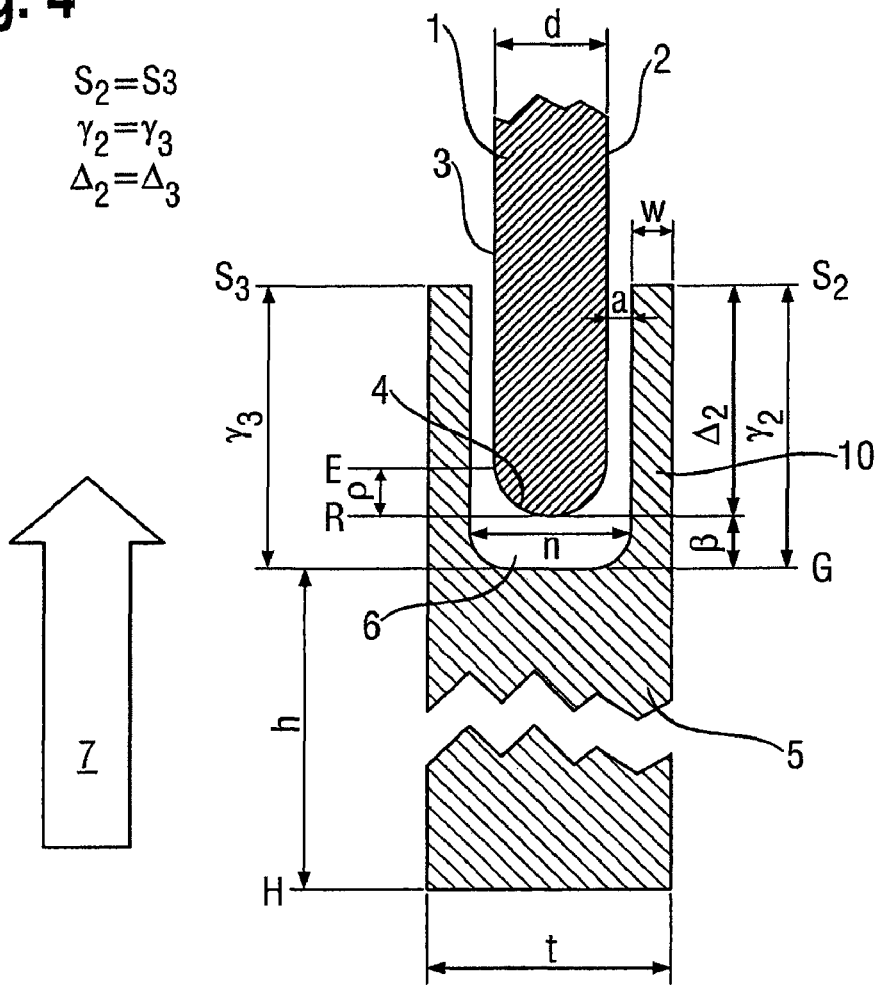
FIG. 4 schematically shows an arrangement comprising a semiconductor wafer and a shield which can be used in an etching method to produce an elevation in the margin of the semiconductor wafer on the front and rear sides thereof.
Figure 5:
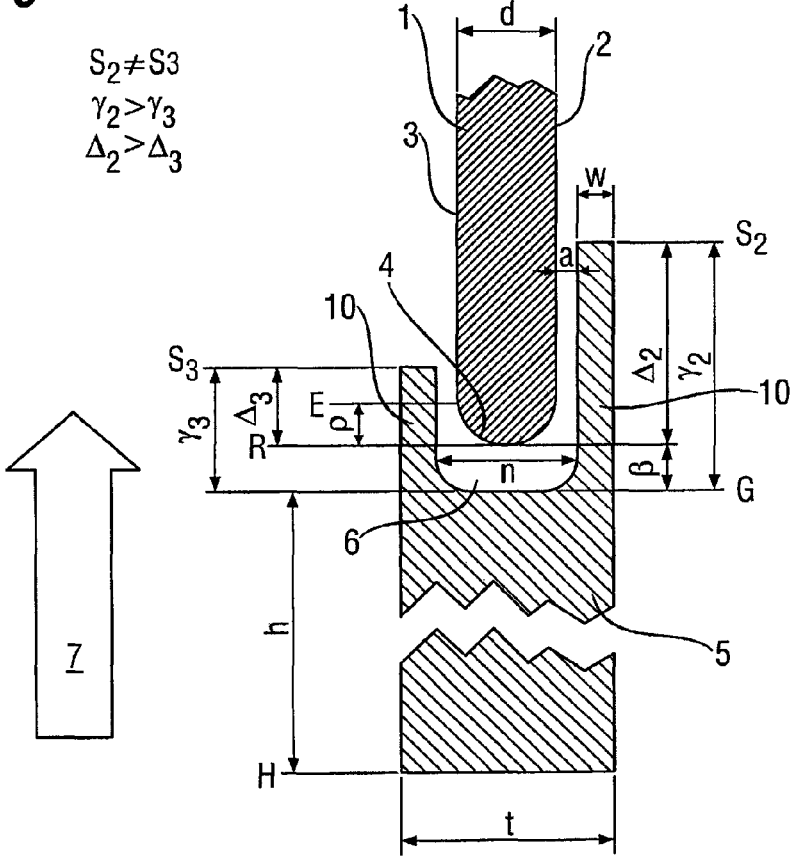
FIG. 5 schematically shows an arrangement comprising a semiconductor wafer and a shield which can be used in an etching method to produce an elevation in the margin of the semiconductor wafer only one side.

The second embodiment of the invention provides for the edge 4 of the semiconductor wafer 1 on which the etchant flows to be at least partly shielded in the manner illustrated in FIGS. 4 and 5. This means that at least part of the edge 4 of the semiconductor wafer that lies in the flow direction 7 of the etchant, including the outermost region of the flat surface of the semiconductor wafer, is shielded. The effect of the shielding on the geometry of the margin of the side surfaces of the semiconductor wafer is the greatest, however, if the circumference of the semiconductor wafer that lies in the flow direction of the etchant is completely shielded. This is therefore also particularly preferred.

In order to achieve this effect, a shield 5 is arranged upstream of the edge 4 of the semiconductor wafer 1 as seen in the flow direction 7 of the etchant, in a manner similar to that illustrated in DE10302611A1. However, in contrast to this prior art, the shield and the arrangement thereof relative to the semiconductor wafer are configured in such a way that the elevation according to the invention arises in the margin of the semiconductor wafer during etching.

This is possible in particular with the arrangement shown in FIGS. 4 and 5. The shield 5 has a lower boundary H lying the furthest away from the edge of the semiconductor wafer, and an upper boundary G lying the closest to the edge of the semiconductor wafer. The dimensions of the shield, in particular the length l and height h, are essentially determined by the size of the semiconductor wafer. The length l is at least somewhat larger than the diameter of the semiconductor wafer. The height h, that is to say the distance between the upper boundary G and the lower boundary H, is preferably 5 to 200 mm, more preferably 30 to 180 mm, for a semiconductor wafer having the diameter 300 mm. The lower boundary H can be straight or rounded in accordance with the sectional illustration shown, with respect to the direction perpendicular to the side surfaces 2, 3 of the semiconductor wafer 1. Furthermore, the body of the shield 5 can have a rectangular circumference in accordance with the sectional illustration with a constant thickness t or can be embodied in a manner tapering toward one or both boundaries (not illustrated). The thickness t of the shield, when simultaneously etching a plurality of semiconductor wafers, is limited by the slot distance between the individual semiconductor wafers. The distance between two adjacent shields should be chosen such that the etching medium can flow through between the shields in a sufficient quantity. The distance $\beta$ between the periphery R of the semiconductor wafer 1 and the upper boundary G of the shield 5 should be at least 0.1 mm, but can also be significantly larger.

In order to optimally shield the region on the wafer surface (front side 2 and/or rear side 3) in the vicinity of the edge 4 and to produce an elevation in the margin by means of the etching process, the shield 5 preferably has at least one projecting part (projection 10) protruding in the direction of the center of the semiconductor wafer 1 in a plane parallel or substantially parallel to the surfaces of the semiconductor wafer. FIGS. 4 and 5 illustrate a projection 10 on both sides of the semiconductor wafer 1; however, it is also conceivable to completely dispense with a projection 10 on one side.

In FIGS. 4 and 5, index 2 for all variables relates to the front side 2 of the semiconductor wafer or the corresponding projection 10, and index 3 relates to the rear side of the semiconductor wafer or the corresponding projection 10. By way of example, $\gamma_2$ denotes the height of the projection 10 that shields the front side of the semiconductor wafer (that is to say the length of the distance between the end $S_2$ of the projection and the upper boundary G of the shield 5), and $\gamma_3$ denotes the height of the projection 10 that shields the rear side of the semiconductor wafer (that is to say the length of the distance between the end $S_3$ of the projection and the upper boundary G of the shield 5). By contrast, index i relates to both projections, that is to say that $\gamma_i$ denotes $\gamma_2$ or $\gamma_3$.

The thickness $W_i$ of the projection 10 is significantly smaller than the thickness t of the shield, such that a distance $a_i$ still remains between the semiconductor wafer 1 (having thickness d) and the projection 10 as seen perpendicular to the surface of the semiconductor wafer 1. The wall thickness $W_i$ should be between 0.1 and 1 mm. The distance $a_i$ between the sides 2 and 3 of the semiconductor wafer and the projections 10 should lie between 0.1 and 1 mm. The projection 10 preferably terminates flush with the surface of the shield 5 on the side remote from the semiconductor wafer 1. The projection has a height $\gamma_i$. If two projections 10 are present, then a cutout 6 having a depth $\gamma_i$ and a width n arises between the projections 10, into which cutout the semiconductor wafer projects by a length $\Delta_i$ in the radial direction. In particular $\Delta_i > \rho_i$, that is to say that the flat surface of the semiconductor wafer is also shielded at the margin by the at least one projection. The width n of the cutout should be chosen such that the shielded regions of the semiconductor wafer do not come into contact with the projections and the semiconductor wafer can be reliably sunk in the cutout.

The length $\Delta_i$ is synonymous with the difference between the height $\gamma_i$ of the projection 10 and the distance $\beta$: $\Delta_i = \gamma_i - \beta$. The length $\Delta_i$, on the side of the semiconductor wafer on which an elevation according to the invention is intended to be produced, preferably lies in the range of 1 to 10 mm, more preferably in the range of 1 to 5 mm.

If an elevation of identical type is intended to be produced on both sides of the semiconductor wafer 1, for example before a double-side polishing process, then shield 5 is constructed symmetrically with respect to the plane of symmetry of the semiconductor wafer, as illustrated in FIG. 4. In particular, the height $\gamma_i$ of the projection 10 is identical on both sides, that is to say that $\gamma_2 = \gamma_3$. This automatically also means that $\Delta_2 = \Delta_3$, with the result that both sides 2 and 3 of the semiconductor wafer are shielded in an identical way in the margin.

By contrast, if an elevation according to the invention is intended to be produced only on one side of the semiconductor wafer 1, for example on the front side 2 in preparation for a single-side polishing of the front side, then preference is given to an asymmetrical embodiment of the shield 5 and, in particular, of the projections 10, as illustrated in FIG. 5. If the height $\gamma_2$ of the projection 10 that shields the front side of the semiconductor wafer differs from the height $\gamma_3$ of the projection 10 that shields the rear side of the semiconductor wafer, a larger elevation can be produced on one side (on the front side 2 in the case of FIG. 5) of the semiconductor wafer than on the other side. In particular, the geometry of the shield can be chosen such that the elevation according to the invention is produced on one side of the semiconductor wafer by means of the etching method, while the other side of the semiconductor wafer remains almost ideally flat in accordance with the teaching of DE10302611A1.

All the shield parameters presented influence the position and extent of the elevation in the margin of the semiconductor wafer and have to be adapted to the subsequent polishing step. The wall thicknesses $W_i$, the heights of the projections $\gamma_i$ and the distances $a_i$ between the semiconductor wafer 1 and the inner sides of the projections 10 can also be embodied asymmetrically. Further important parameters, alongside the geometrical dimensions of the shield are the flow rate of the etching medium and the rotational speed of the semiconductor wafers during etching. These parameters should be chosen by means of simple preliminary experiments in a suitable manner in order to obtain the effect according to the invention.

The elevation according to the invention can also be produced by means of other methods. By way of example, the elevation can be produced by spraying an etchant onto at least one side of the semiconductor wafer, wherein that margin of the semiconductor wafer in which the elevation is intended to be produced is covered. In this way, the margin is not exposed to an etching attack, with the result that an elevation arises in the margin.

The subsequent polishing and, if appropriate, cleaning steps that are effective beforehand and afterward should be performed in accordance with the prior art. At least one polishing of at least the front side of the semiconductor wafer is carried out. The polishing can be carried out as single-side polishing or as double-side polishing. In the case of the single-side polishing of the front side, the semiconductor wafer is fixed, for example adhesively bonded, by the rear side on a support plate. In the case of double-side polishing, the semiconductor wafer lies in freely movable fashion in a cutout in a carrier.

During the subsequent polishing, the geometry fault intentionally produced during the etching is precisely compensated for by a material removal that is locally increased in the region of the wafer edge. This material removal would otherwise lead to an edge roll-off, and so a semiconductor wafer that is extremely flat up to the edge results.

If the front side is polished a number of times, it is expedient for the first polishing process to be configured as stock removal polishing and for the final polishing process to be configured as touch polishing, which essentially differ in terms of the material removal obtained in the course of polishing. The material removal is generally 2 μm or less in the case of touch polishing and 3 μm or more in the case of stock removal polishing. In addition to the final polishing process, the semiconductor wafer can also be coated, for example by an epitaxial layer being deposited on the front side and/or by the rear side being sealed with a layer of polycrystalline material and/or with an oxide layer. On each side that previously had a local elevation according to the invention in the edge region, the material removal caused by the polishing preferably lies in the range of 3 to 30 μm.

A particularly preferred process sequence for the production of the claimed semiconductor wafer comprises slicing off the semiconductor wafer by sawing a single crystal, rounding the edge of the semiconductor wafer, if appropriate grinding the semiconductor wafer, which can be performed as single-side grinding or sequential or simultaneous double-side grinding, and/or lapping, wet-chemical etching, if appropriate edge polishing, and also polishing of the semiconductor wafer, which is carried out at least once, cleaning steps carried out between the processes, and one or more coating processes carried out after the final polishing of a side surface. The local elevation in the margin can preferably be produced by grinding or etching, a combination of these two methods also being conceivable. By way of example, an elevation produced by grinding in accordance with the first embodiment of the invention at the edge of the semiconductor wafer can again be additionally shaped and, if appropriate, reinforced by means of an etching step in accordance with the second embodiment of the invention.

EXAMPLES AND COMPARATIVE EXAMPLES

Semiconductor wafers composed of silicon were sliced from a cylindrical silicon single crystal having a diameter of 300 mm by means of a wire gang saw. All the semiconductor wafers were subsequently processed in the same way by simultaneous double-side grinding. The semiconductor wafers were then subjected to an etching method. By using a hydrogen fluoride/nitric acid solution with dispersed small gas bubbles, a total of 25 μm (sum of the etching removals on the front and rear sides) were etched away. The rotational speed of the semiconductor wafers during etching was 3.0 rpm at an inflow rate of the etching medium into the etching tank of 165 l/min.

During the etching of the semiconductor wafers, various edge geometries were produced by different shielding of the margin of the semiconductor wafers. The following settings were used here:

Comparative Example 1: without shield
Comparative Example 2: with shield in accordance with FIG. 4 (t=2.5 mm/$\gamma_2=\gamma_3$=0.4 mm/$\Delta_i$32 0.25 mm)
Example: with shield in accordance with FIG. 4 (t=2.5 mm/$\gamma_2=\gamma_3$=2.0 mm/$\Delta_i$=1.85 mm)

The width n of the cutout 6 was 2 mm in each case in all the examples and comparative examples.

The semiconductor wafers were measured after etching by means of an edge roll-off measuring device Kobelco LER 310.

Figure 6:
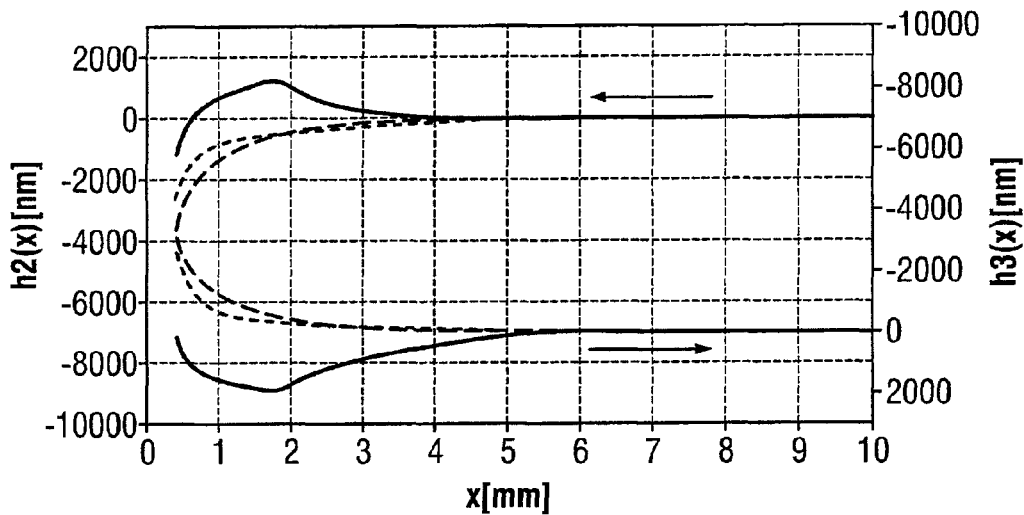
FIG. 6 shows various margin geometries that were produced by means of an etching method using different shields and without a shield.

FIG. 6 illustrates the corresponding radial profiles h(x) of the topography of the semiconductor wafers near the edge, wherein the left-hand ordinate relates to the profile $h_2(x)$ of the front side (upper three curves) and the right-hand ordinate relates to the profile $h_3(x)$ of the rear side of the semiconductor wafer (lower three curves). In the case of comparative example 1 (without shield; dashed lines in FIG. 6), a significant edge roll-off occurs on the front and rear sides. An edge roll-off can additionally be ascertained also in the case of comparative example 2 (with shield and with small insertion depth of the semiconductor wafer 1 into the cutout 6 of $\Delta_i$=0.25 mm; dotted line in FIG. 6), this edge roll-off being reduced relative to comparative example 1. It is only in the case of a significantly larger insertion depth $\Delta_i$=1.85 mm in accordance with the example that a local elevation occurs at the wafer margin with a maximum height $h_{R,max}$ of approximately 1.2 μm (solid line in FIG. 6). The height maximum lies at a distance of approximately 1.7 mm from the outermost periphery R of the wafer.

After the measurement, the semiconductor wafers in accordance with all the examples and comparative examples were uniformly divided among a total of eight polishing passes and polished on a double-side polishing machine of the type AC 2000 from Peter Wolters AG. The polishing removal was in total 20 μm (sum of the polishing removals on the front and rear sides). The semiconductor wafers were cleaned after polishing and then their flatness (PSFQR) was measured by means of a measuring device of the type Wafersight from KLA-Tencor Corporation. The average values obtained and also the further results of the statistical evaluation are presented in the table below.

|  | Comparative example 1 | Comparative example 2 | Example |
| --- | --- | --- | --- |
| Number of wafers n | 18 | 33 | 36 |
| Average value PSFQR [nm] | 49.1 | 34.7 | 29.1 |
| Standard deviation [nm] | 3.1 | 2.6 | 2.8 |
| 10% value [nm] | 45.7 | 31.2 | 25.5 |
| 50% value [nm] | 49.5 | 34.0 | 29.5 |
| 90% value [nm] | 53.0 | 38.0 | 32.5 |
| 95% value [nm] | 53.3 | 38.0 | 33.0 |
| 99.7% value [nm] | 54.9 | 38.9 | 33.0 |

Boundary conditions for the PSFQR measurements:
Edge exclusion EE=2 mm
Measurement field size=20 mm×20 mm
Offset of the grid field in the x direction=10 mm
Offset of the grid field in the y direction=10 mm It becomes clear that the semiconductor wafers having the elevation according to the invention (example) in the edge region achieve the best $PSFQR_{avg}$ value after polishing given identical polishing parameters.

The present invention can be applied to all semiconductor wafers which ultimately are subjected to single- or double-side polishing. These are, in particular, monocrystalline semiconductor wafers that are provided for the production of electronic components. These are preferably substantially composed of silicon.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a polished semiconductor wafer having two sides and an edge, comprising the following steps in the stated order:
    a) slicing a semiconductor wafer from a rod composed of semiconductor material,
    b) material-removal processing at least one side of the semiconductor wafer, and
    c) polishing at least one side of the semiconductor wafer, wherein the semiconductor wafer has along its margin, after material-removal processing and before polishing on at least one side to be polished, a ring-shaped local elevation having a maximum height of at least 0.1 µm, wherein the local elevation reaches its maximum height within a 10 mm wide ring proceeding inwardly from the edge of the semiconductor wafer.

2. The method of claim 1, wherein material removal caused by polishing, on each side of the semiconductor wafer that is polished, is 3 to 30 µm.

3. The method of claim 1, wherein the material-removal processing further comprises at least one treatment of the semiconductor wafer with a liquid etchant, wherein the etchant flows during the treatment substantially parallel to the surfaces of the semiconductor wafer onto a margin of the semiconductor wafer, and wherein the local elevation is produced by an at least partial shielding of the ring proceeding inwardly from the edge of the semiconductor wafer against the etchant flowing directly thereon.

4. The method of claim 1, wherein the material-removal processing comprises at least one treatment of the semiconductor wafer with a liquid etchant, wherein the etchant is sprayed onto at least one side of the semiconductor wafer, wherein the ring proceeding inwardly from the edge of the semiconductor wafer is at least partly covered.

5. The method of claim 1, wherein the material-removal processing comprises at least one grinding treatment of at least one side of the semiconductor wafer by means of at least one cup grinding disk, wherein the at least one cup grinding disk is positioned relative to the semiconductor wafer during the grinding treatment in such a way that a ring proceeding inwardly from the edge of the semiconductor wafer remains unprocessed, such that the local elevation arises during the grinding treatment on the surface of the ring.

6. The method of claim 1, wherein the local elevation reaches its maximum height within a 5 mm wide ring proceeding inwardly from the edge of the semiconductor wafer.

7. The method of claim 6, wherein the maximum height of the local elevation is 0.1 to 10 µm.

8. The method of claim 6, wherein the maximum height of the local elevation is 0.5 to 5 µm.

9. The method of claim 6, wherein material removal caused by polishing, on each side of the semiconductor wafer that is polished, is 3 to 30 µm.

10. The method of claim 1, wherein the maximum height of the local elevation is 0.1 to 10 µm.

11. The method of claim 10, wherein material removal caused by polishing, on each side of the semiconductor wafer that is polished, is 3 to 30 µm.

12. The method of claim 1, wherein the maximum height of the local elevation is 0.5 to 5 µm.

13. The method of claim 12, wherein material removal caused by polishing, on each side of the semiconductor wafer that is polished, is 3 to 30 µm.

* * * * *